US011144805B2

(12) United States Patent
Huang et al.

(10) Patent No.: US 11,144,805 B2
(45) Date of Patent: Oct. 12, 2021

(54) SPHERICAL IDENTIFIERS

(71) Applicant: Hewlett-Packard Development Company, L.P., Spring, TX (US)

(72) Inventors: Wei Huang, Palo Alto, CA (US); Steven J. Simske, Fort Collins, CO (US); Gary J. Dispoto, Palo Alto, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/628,750

(22) PCT Filed: Jul. 12, 2017

(86) PCT No.: PCT/US2017/041648
§ 371 (c)(1),
(2) Date: Jan. 6, 2020

(87) PCT Pub. No.: WO2019/013774
PCT Pub. Date: Jan. 17, 2019

(65) Prior Publication Data
US 2020/0285922 A1  Sep. 10, 2020

(51) Int. Cl.
*G06K 19/06* (2006.01)
*G06F 30/17* (2020.01)

(52) U.S. Cl.
CPC ....... *G06K 19/06018* (2013.01); *G06F 30/17* (2020.01); *G06K 19/0614* (2013.01)

(58) Field of Classification Search
CPC ......... G06K 19/06018; G06K 19/0614; G06K 19/06084; G06K 19/06168; G06K 19/04; G06K 7/00; G06K 7/04; G06K 19/06037; G06F 30/17
See application file for complete search history.

(56) References Cited

U.S. PATENT DOCUMENTS

| 5,500,512 | A | 3/1996 | Goldblatt |
| 7,390,135 | B2 | 6/2008 | Bateman et al. |
| 7,611,058 | B2 | 11/2009 | Culp et al. |
| 9,082,053 | B2 * | 7/2015 | Yang ................ G06K 19/06046 |
| 9,400,910 | B2 | 7/2016 | Kumar et al. |
| 9,656,428 | B2 | 5/2017 | Voris et al. |

(Continued)

FOREIGN PATENT DOCUMENTS

| CN | 105489141 | 4/2016 |
| WO | WO-2017051999 A1 | 3/2017 |

OTHER PUBLICATIONS

N. M. Bidgoli, T. Maugey and A. Roumy, "Intra-coding of 360-degree images on the sphere," 2019 Picture Coding Symposium (PCS), 2019, pp. 1-5, doi: 10.1109/PCS48520.2019.8954538.*

(Continued)

*Primary Examiner* — Seung H Lee
(74) *Attorney, Agent, or Firm* — Fabian VanCott

(57) ABSTRACT

A spherical identifier may, in an example, include a sphere including a plurality of shells forming the sphere, a radially-defined code being discernable using the arrangement of the plurality of shells. A three-dimensional object identifier may, in an example, include a number of spheres manufactured into the body of the three-dimensional object wherein each of the spheres comprise a plurality of shells; the shells constituting a radially definable code.

20 Claims, 5 Drawing Sheets

(56) References Cited

U.S. PATENT DOCUMENTS

| | | |
|---|---|---|
| 2012/0052967 A1 | 3/2012 | Grieshaber et al. |
| 2015/0001750 A1 | 1/2015 | Kozlak et al. |
| 2015/0378353 A1 | 12/2015 | Williams et al. |
| 2016/0067927 A1 | 3/2016 | Voris et al. |
| 2017/0210116 A1* | 7/2017 | Shirakawa ............. B33Y 50/02 |
| 2017/0311164 A1* | 10/2017 | Shin ....................... G06K 19/14 |

OTHER PUBLICATIONS

Martin, Simon, "InfraStructs: Embedded ID Tags in 3D Printed Objects Eliminate Need for RFID and Barcodes," Jul. 23, 2013. Available at: < https://www.solidsmack.com/3d-cad-technology/infrastructs-embedded-id-tags-in-3d-printed-objects-eliminate-need-for-rfid-and-barcodes/ >.

* cited by examiner

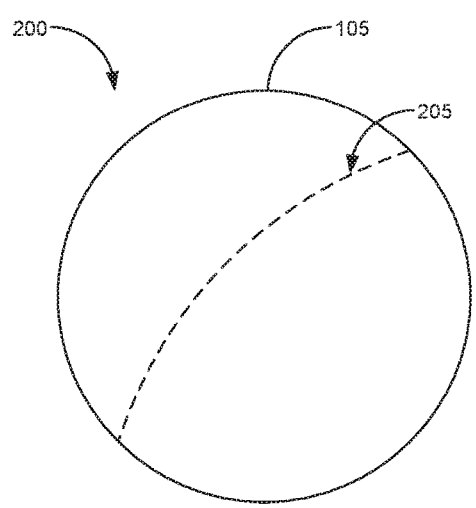
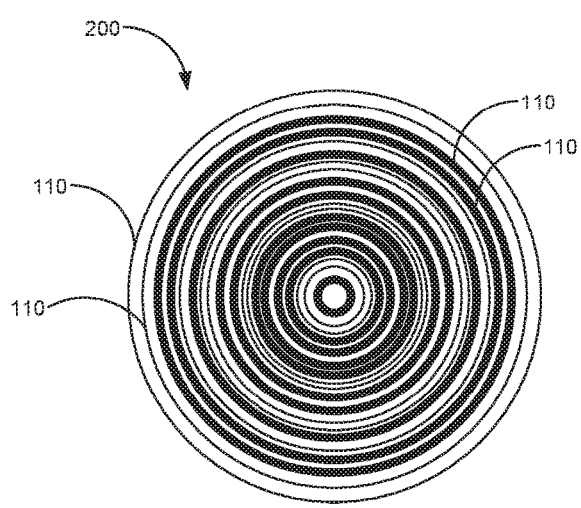
Fig. 2A
Fig. 2B

SPHERICAL IDENTIFIERS

BACKGROUND

Three-dimensional (3D) printing allows users to of a 3D printing device to create a myriad of different objects from simple geometric shapes to complex parts. Indeed, when 3D printed parts become defective, a user may print out another 3D part as a replacement.

BRIEF DESCRIPTION OF THE DRAWINGS

The accompanying drawings illustrate various examples of the principles described herein and are part of the specification. The illustrated examples are given merely for illustration, and do not limit the scope of the claims.

FIGS. 2A and 2B are a front and cut-away diagrams of a spherical identifier, respectively, according to an example of the principles described herein.

Figure 1:
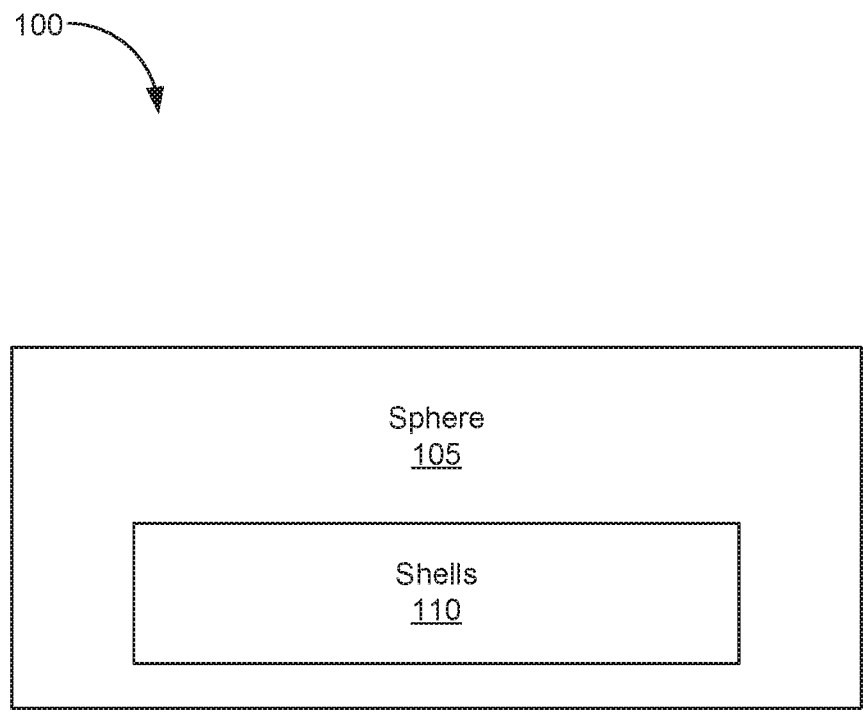
FIG. 1 is a diagram of a spherical identifier according to an example of the principles described herein.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

When a 3D printed part reaches the end of its useful life through, for example, wear-and-tear or mechanical failure, information related to that part may not readily be available. Indeed, if the part was 3D printed and shipped to the end consumer, the end consumer may not know the complete details of the product and manufacturing information (PMI), the production date of the 3D part, the 3D printer information used to print the 3D printed part, among other information. Knowing this information, it may be relatively easier for a user to obtain information regarding the 3D printed part so that a replacement can be found, the 3D printed part can be properly recycled, and a proper investigation as to the defectiveness of the part can be conducted, among other operations.

In some instances, part identification has included surface marks such as barcodes and quick response (QR) code. However, these may become unsightly and affect the aesthetics of the 3D printed part whether they are in the form of a sticker placed on the product or 3D printed into the surface of the 3D object. Additionally, barcodes and QR codes are susceptible to surface wear thereby preventing a user from acquiring the information about the 3D part.

In other instances, one-dimensional (1D) or two-dimensional (2D) embedded marks have been used. However, 1D and 2D embedded marks must implement specific location and orientation within the 3D object. Specifically, in order to obtain the information, the location of the 1D and/or 2D embedded mark is to be known as well as the proper cutting plane used to reveal the information thereon. Without specific instruction, an end-user of the 3D printed part having a 1D and/or 2D embedded mark would not be able to access the information on the 1D or 2D embedded mark.

In still other instances, 3D embedded marks may be difficult to retrieve information from because proper detection may use special scanning equipment. In some instances, RFID tags are embedded into the 3D printed part necessitating the use of an RFID tag reader.

The present specification describes a 3D identifier that is embedded into the 3D printed part during the 3D printing process. The 3D identifier includes a plurality of shells that form, together, a sphere shape. The shells may define a radial coding that can be extrapolated and information related to the patter defined by the radial code may be associated with the radial code. In some examples, the radial code may be converted into a single dimensional barcode (1D barcode) to be read on a computing device or directly read by a scanner. In the examples described herein, the embedded spherical identifier may be exposed by grinding the 3D printed part down at any location in order to reveal a great circle of the spherical identifier.

The present specification describes a spherical identifier that includes a sphere including a plurality of shells forming the sphere, a radially-defined code being discernable using the arrangement of the plurality of shells.

The present specification also describes a three-dimensional object identifier that includes a number of spheres manufactured into the body of the three-dimensional object wherein each of the spheres comprise a plurality of shells; the shells constituting a radially definable code.

The present specification further describes a method of identifying a three-dimensional object that includes removing a portion of the three-dimensional object to reveal the orthodrome of a sphere embedded in the three-dimensional object and translating a radial pattern of the sphere into a one-dimensional (1D) barcode.

As used in the present specification and in the appended claims, the term "great circle" or "orthodrome" is meant to be understood as intersection of the sphere and a plane that passes through the center point of the sphere.

Additionally, as used in the present specification and in the appended claims, the term "a number of" or similar language is meant to be understood broadly as any positive number comprising 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may or may not be included in other examples.

Turning now to the figures, FIG. 1 is a block diagram of a spherical identifier (100) according to an example of the principles described herein. The spherical identifier (100) may include a sphere (105) with each of the spheres (105) including a plurality of shells (110).

The spherical identifier (100) may be embedded within a 3D printed part. In an example, the spherical identifier (100) is printed into the 3D printed part during the 3D printing process of the 3D printed part. In an example, the spherical identifier (100) is printed into the 3D printed part using the same or similar materials used to print the 3D printed part.

In this example, the spherical identifier (100) may differ from the rest of the material used to make the 3D printed part by color, texture, pattern, among others.

The sphere (105) may be any size of sphere. In an example, a percentage of the 3D printed part may be filled with a plurality of spheres (105). In an example 25% to 100% of the 3D printed part is filled with a plurality of spheres (105) formed when the 3D printed part is printed in a 3D printing device. In an example 50% to 100% of the 3D printed part is filled with a plurality of spheres (105) formed when the 3D printed part is printed in a 3D printing device. In an example 100% of the 3D printed part is filled with a plurality of spheres (105) formed when the 3D printed part is printed in a 3D printing device. In these examples, the 3D printed part is filled with 100% of spheres (105) when the outer surface of each of the spheres (105) touch either another sphere (105) or an exterior surface of the 3D printed part.

As described above, each of the spheres (105) may include a plurality of shells (110) that define a radial code. The shells (110) may be any number of concentric shells layered one over the other to form the sphere (105). In some examples, the thickness of each of the shells (110) may help define the radial code with certain alpha-numeric symbols being assigned or otherwise associated with a certain thickness, colors, or types of individual shells (110). This allows for a particular alpha-numeric code to be associated with the 3D printed part when the radial code is scanned. In an example, the thickness, color, type, and/or number of each of the shells (110) may be represented as a one-dimensional (1D) barcode with similar features such as left, center, and right guard bars or fiducials, manufacture identification bars, item identification bars, and/or module check bars. Thus, as the scanner reads the radial code defined by the shells (110) of the sphere (105), they may be converted into the 1D barcode having similar characteristics of a 1D barcode.

FIGS. 2A and 2B are a front and cut-away diagrams of a spherical identifier (100), respectively, according to an example of the principles described herein. As described herein, the spherical identifier (100) may be formed within a 3D printed part. Additionally, the spherical identifier (100) may be printed using the same or similar material as that used to print the 3D printed part. The spherical identifier (100) may include a plurality of shells (110) formed concentrically around each other with a final shell (110) as a final layer forming the spherical identifier (100). The spherical identifier (100) may further include a great circle (205) that defines the intersection of the sphere (105) and a plane that passes through the center point of the sphere (105). FIG. 2B is the graphical representation of that plane parallel with the surface of the image. Thus, the great circle (205) defines a plane that reveals all of the shells (110). During operation, a user may carve a portion of a 3D printed part to reveal this great circle (205) and scan the shells (110) using a scanner. This is done in order to extrapolate data from the pattern defined by the shells (110).

Although FIG. 2B shows the plurality of shells (110) being black and white, any color or pattern may be used to define different shells (110) as well as the boundaries between the shells (110). By so doing, the thickness, color, and/or pattern of each of the shells (110) may be associated with a symbol such as an alphanumeric symbol. A scanner may scan the shells (110) and extrapolate the pattern thereby extrapolating a code defined by the alphanumeric symbols associated with each of the shells (110).

In an example, a computing device associated with the scanner may, upon execution of a processing device, convert the extrapolated code into a 1D barcode. This may be done by taking a ray or diameter of the shells (110), measuring their thicknesses via image processing and creating vertical lines with similar thicknesses. This 1D barcode extrapolated from the reading of the spherical identifier (100) may be read by a scanner and information related to the part may be presented to a user via a user interface or other output device of a scanner or computing device. In an example, the 1D barcode may be printed using a printer associated with the computing device and the user may attach the barcode to the 3D printed part in order to send the part to a seller for identification and replacement.

Figure 3:
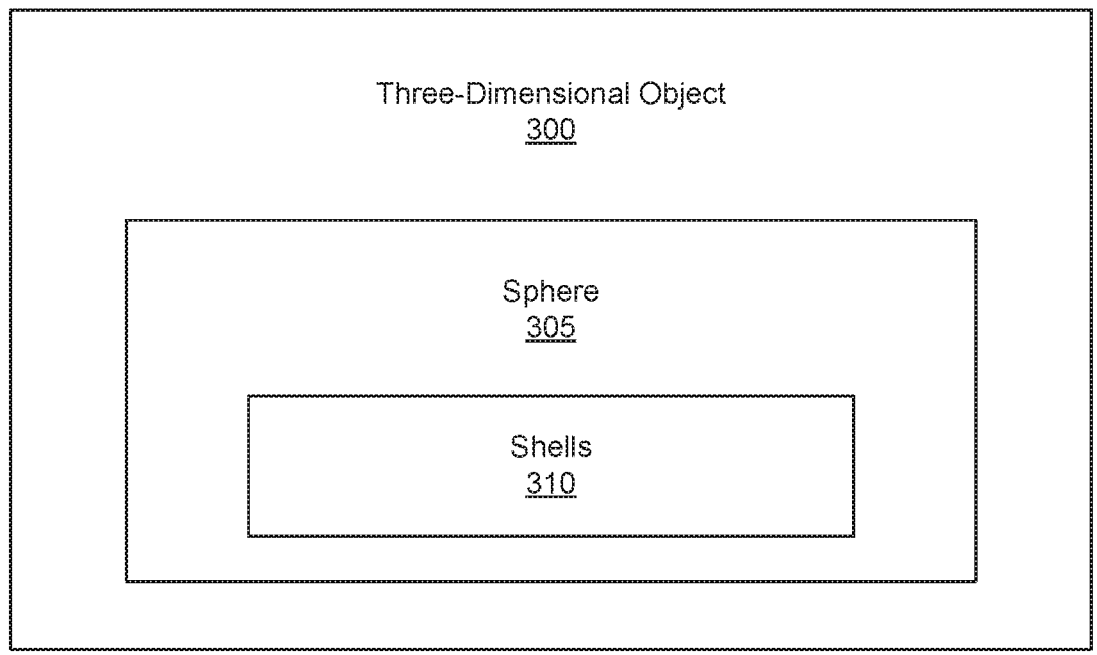
FIG. 3 is a block diagram of a three-dimensional object according to an example of the principles described herein.
Figure 4:
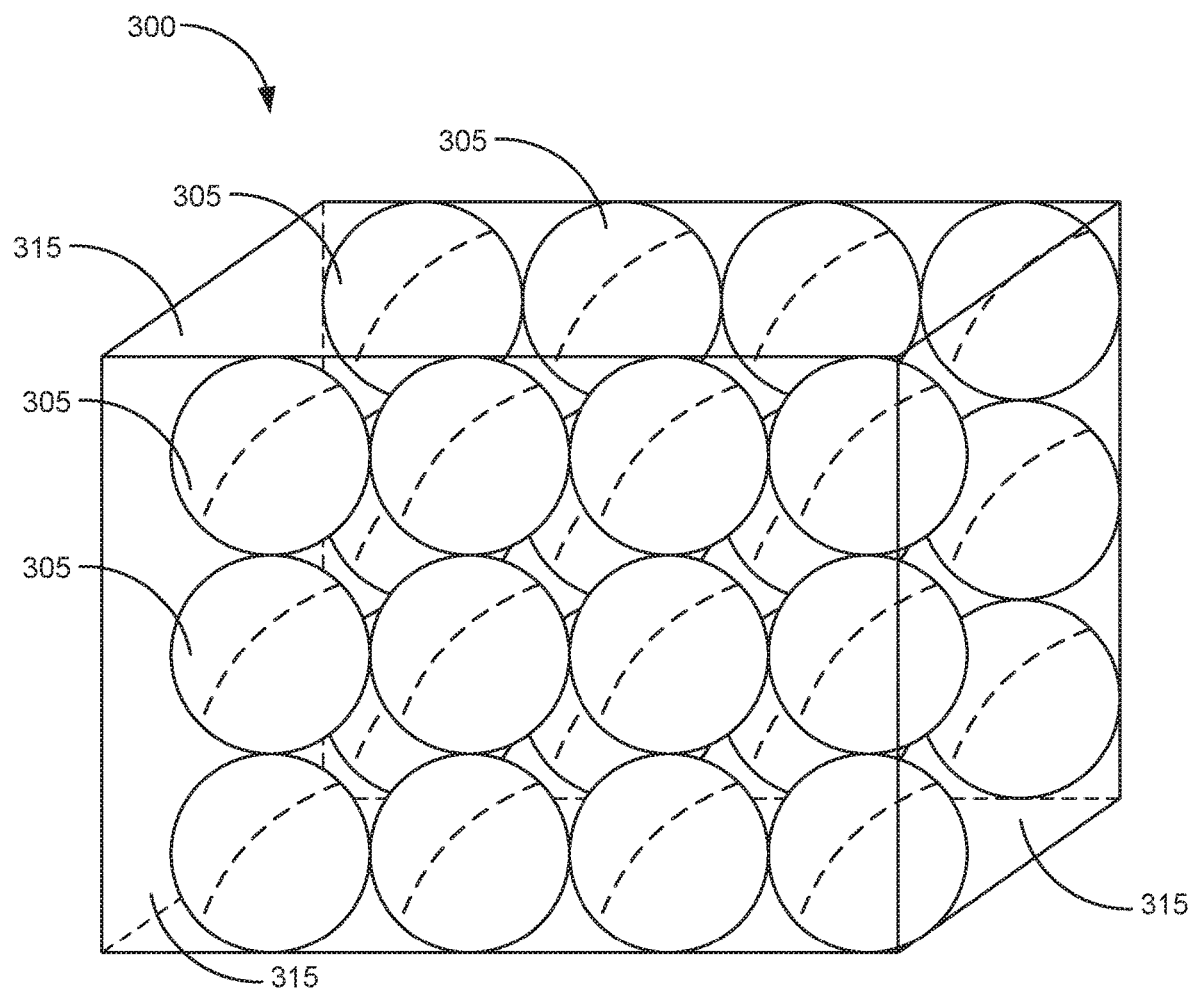
FIG. 4 is a graphical representation of the 3D object according to an example of the principles described herein.

FIG. 3 is a block diagram of a three-dimensional (3D) object (300) according to an example of the principles described herein. FIG. 4 is a graphical representation of the 3D object (300) according to an example of the principles described herein. The 3D object (300) may include a number of spheres (305) manufactured into the body of the 3D object (300) with each of the spheres (105) including a plurality of shells (310) constituting a radially definable code. As described herein, the radially defined code may be scanned by a scanning device after a great circle (FIG. 2, 205) has been revealed during a grinding or material removal process of the 3D object (300).

As can be seen in FIG. 4, an entirety of the 3D object (300) may be filled with spheres (305). During printing of the 3D object (300) in a 3D printing device, the individual shells (310) of each of the spheres (305) may be printed along with the 3D object (300). In this example, cross-sections of each of the spheres (305) and their shells (310) may be incorporated into the layer data used to print the 3D object (300).

FIG. 4 shows that an outer surface of each of the spheres (305) touches either another sphere (305) or an exterior wall (315) of the 3D object (300). In an example, a thin layer of the 3D object (300) may be maintained between the spheres (305) and the exterior walls of the 3D object (300) so as to maintain an aesthetic look of the finished 3D object (300) after printing. In an example, the 3D object (300) may not be entirely or almost entirely filled with the spheres (305). Instead, at least one sphere (305) may be printed within the 3D object (300) during the 3D printing process. This at least one sphere (305) may be printed in a location within the body of the 3D object (300) that is readily understood and can be grinded down by a user to reveal the great circle (FIG. 2, 205) and, consequently, the pattern of the shells (310). In an example, a location marker may be added to the exterior surface of the 3D object (300) marking the location of the at least one sphere (305) as well as the location a user can remove a portion of the material of the 3D object (300) in order to reveal the great circle (FIG. 2, 205) of the at least one sphere (305).

In an example, a user grinding down a portion of the 3D object (300) may know when the great circle (FIG. 2, 205) of the sphere (305) is reached when the width of the diameter of the sphere (305) stops expanding. In an example, a center indicator may be provided marking the center of the great circle (FIG. 2, 205). by revealing the center marking a user may know that the great circle (FIG. 2, 205) is also revealed. With these examples, a user is made aware of how to grind down a portion of the 3D object (300) and sphere (305) gradually and at any angle and still be able to reveal the pattern of the shells (310) and consequently the code defined by those shells. In some examples, portions of the shells (310) may be revealed during the grinding process. However, the code defined by the shells (310) may still be read as long as a radial pattern is revealed. That is, in some examples, as long as a radius pattern of the shells (310) can be revealed on the great circle (FIG. 2, 205) plane, the code defined by the shells (310) may still be scanned and read.

In some examples where a full sphere (305) cannot be formed within a portion of the 3D object (300), partial spheres may still be formed. In this example, a portion of the sphere (305) may still reveal the code via a number of shells (310) that, when scanned as described herein, provide information about the 3D objection (300).

The 3D object (300) and spheres (305) described herein provide for a way a user can readily discover certain information regarding the 3D object (300) that has been 3D printed. Because the spheres (305) are embedded within the 3D object (300) they may preserve the aesthetics of the 3D object (300) being printed thereby maintaining a manufactured look of the 3D object (300). Additionally, by embedding the spheres (305) in to the 3D object (300), no additional material may be used and instead the 3D object (300) may be manufactured using similar materials that have similar build characteristics as the surrounding build material used to build the 3D object (300). This, in turn, may reduce the build time of the 3D object (300) as well as the cost associated with the 3D printing process.

Further, due to the nature of the spherical geometry of the spheres (305), the shells (310) defining the spheres (305) may be scanned at the great circle (FIG. 2, 205) in any orientation. Thus, a user grinding or otherwise removing a portion of the 3D object (300) and the spheres (305) to obtain the great circle (FIG. 2, 205) has some flexibility in how the spheres (305) are revealed. In some examples, the exact plane defining the great circle (FIG. 2, 205) of the spheres (305) may not need to be revealed and instead, so long as the scanner can detect the pattern of the shells (310), a code may be extrapolated and information about the part may be presented. Indeed, in some examples, this part information can be retrieved even when a small piece of the 3D object (300) is grinded down by the user. Still further, in some examples less than all of the great circle (FIG. 2, 205) may be revealed such that the radial code of half of the great circle (FIG. 2, 205) can be scanned. In some examples, because an opposite radius of the great circle (FIG. 2, 205) will be a mirror image of any given radius. Consequently, in examples where the entire diameter of the sphere (305) is scanned to reveal a code, the other half of the code may be extrapolated from a half ground great circle (FIG. 2, 205).

In some examples, the code defined by the shells (310) of the spheres (305) may be read on non-flat surfaces of the 3D object (300). This may be accomplished so long as a complete set of the shells (310) is revealed.

The radial coding defined herein may be flexible. In some examples, the thickness, color, and/or pattern of the individual shells (310) or a group of shells (310) may be associated with any alphanumeric character or other character as the system is set up.

In some examples, the 3D object (300) may include a plurality of different spheres (305) each having different codes therein defined by the shells (310). In this example, the code revealed by any of the shells (310) of the spheres (305) may identify the location of the spheres (305). Location identification may add some security to the manufacturing of the part. Indeed, the spheres (305), their location within the 3D object (300), the number of spheres (305), the existence of the spheres (305), and/or each of the codes defined by the shells (310) in each of the spheres (305) may be used to authenticate the manufacturing source of the 3D object (300). Consequently, a user may readily determine whether a part is a genuine part manufactured by a specific manufacturer or a counterfeit par manufactured by some other manufacturer.

In some examples, the spheres (305) defined in the 3D object (300) may have different diameters in order to fill more of the space within the 3D object (300). In this example, the code defined by the shells (310) of each of the varying diameter spheres (305) may be the same. In this example, the relative thickness of the individual shells (310) within any given sphere (305) may be determined. This allows smaller diameter spheres (305) to be used that, when scanned, provide the same code information. This further allows a greater portion of the 3D object (300) to be filled with relatively greater numbers of spheres (305) such that a user may have a relatively better chance of finding an embedded sphere (305) within the 3D object (300) during the grinding process.

Figure 5:
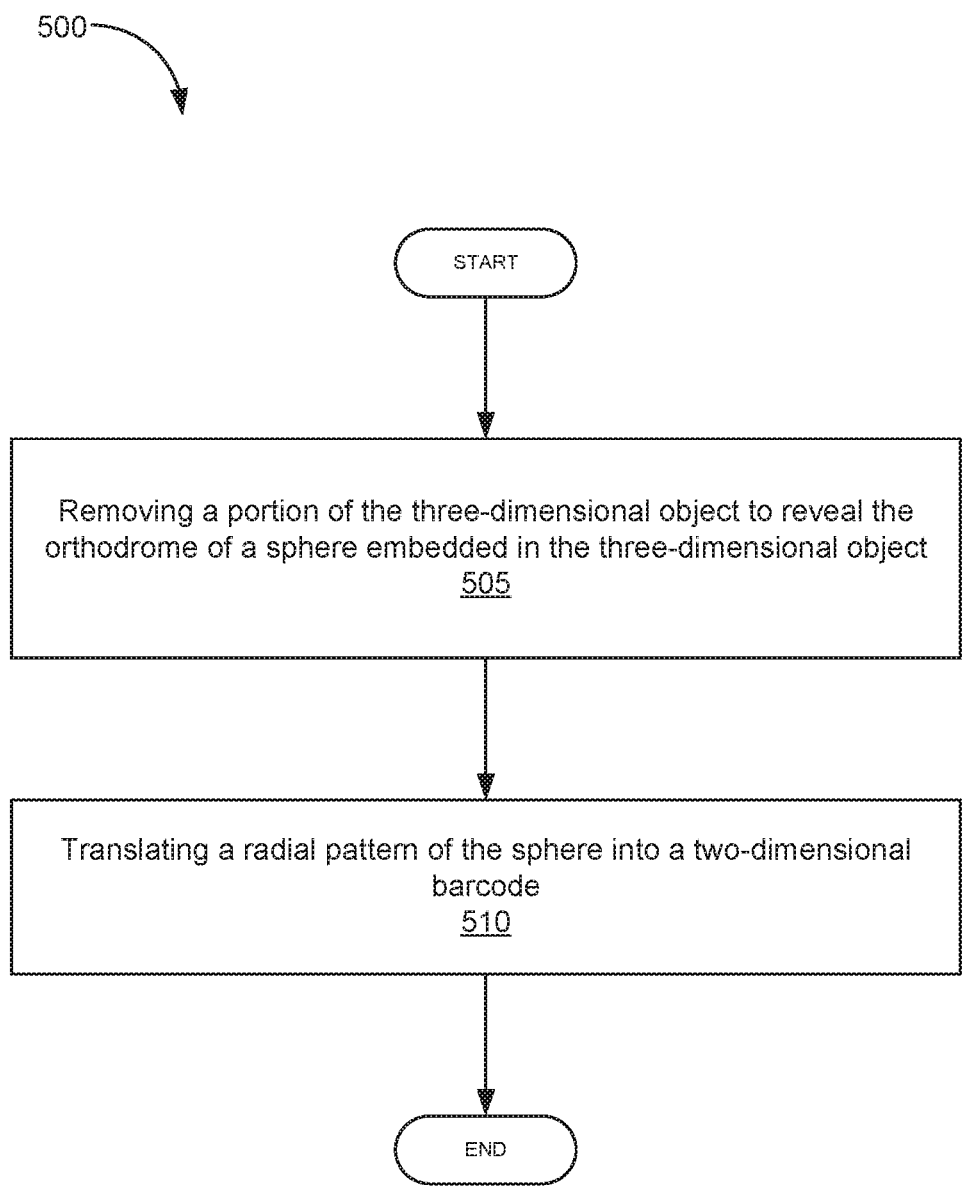
FIG. 5 is a flowchart describing a method (500) of identifying a three-dimensional object according to an example of the principles described herein.

FIG. 5 is a flowchart describing a method (500) of identifying a three-dimensional object according to an example of the principles described herein. The method (500) may begin with removing a portion of a 3D object (300) to reveal an orthodrome or great circle (FIG. 2, 205) of a sphere (305) embedded within the 3D object (300). This may be done manually or by using a machining device. The method (500) may continue with translating a radial pattern of the spheres (305) as defined by its shells (310) into a one-dimensional (1D) barcode. In this example, the 1D barcode may be used by a scanning device to determine specific information about the 3D object (300) such as part number, manufacturer, manufacturing facility, replacement code, manufacturer contact information, among other information related to the existence and replacement of the 3D object (300).

In some examples, the materials used to form the shells (310) of the spheres (305) may have different properties apart from the build material used to build the 3D object (300). In some examples, the materials used to form the shells (310) may have different conductivity, stiffness, and/or electromagnetism. In this example, the 3D object (300) may not need to be ground down in order to reveal the spheres (305) but instead different devices such as an ultrasound device, vibration device, or magnetic device could detect the spheres (305) and read the code defined by the shells (310) defining each of the spheres (305).

As discussed herein, a scanning device may be used to scan the shells (310) of the spheres (305) in order to detect the code defined by the shells (310). The scanning device forms part of or may be communicatively coupled to a computing device. In either example, to achieve its desired functionality, the scanning device may include various hardware components. Among these hardware components may be a number of processors, a number of data storage devices, a number of peripheral device adapters, and a number of network adapters. These hardware components may be interconnected through the use of a number of busses and/or network connections. In one example, the processor, data storage device, peripheral device adapters, and a network adapter may be communicatively coupled via a bus The processor may include the hardware architecture to retrieve executable code from the data storage device and execute the executable code. The executable code may, when executed by the processor, cause the processor to implement at least the functionality of reading a code defined by the shells (310), translating a radial pattern of the sphere into a one-dimensional barcode, presenting data presented via the code, and presenting a number of graphical user interfaces to a user via a display device, according to the methods of the present specification described herein. In the course of executing code, the processor may receive input from and provide output to a number of the remaining hardware units.

The data storage device may store data such as executable program code that is executed by the processor or other processing device. As will be discussed, the data storage device may specifically store computer code representing a number of applications that the processor executes to implement at least the functionality described herein.

The data storage device may include various types of memory modules, including volatile and nonvolatile memory. For example, the data storage device of the present example includes Random Access Memory (RAM) (106), Read Only Memory (ROM), and Hard Disk Drive (HDD) memory. Many other types of memory may also be utilized, and the present specification contemplates the use of many varying type(s) of memory in the data storage device as may suit a particular application of the principles described herein. In certain examples, different types of memory in the data storage device may be used for different data storage needs. For example, in certain examples the processor may boot from Read Only Memory (ROM), maintain nonvolatile storage in the Hard Disk Drive (HDD) memory, and execute program code stored in Random Access Memory (RAM).

Generally, the data storage device may comprise a computer readable medium, a computer readable storage medium, or a non-transitory computer readable medium, among others. For example, the data storage device may be, but not limited to, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a random-access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store computer usable program code for use by or in connection with an instruction execution system, apparatus, or device. In another example, a computer readable storage medium may be any non-transitory medium that can contain, or store a program for use by or in connection with an instruction execution system, apparatus, or device.

The hardware adapters in the scanning device enable the processor to interface with various other hardware elements, external and internal to the scanning device. For example, the peripheral device adapters may provide an interface to input/output devices, such as, for example, display device, a mouse, or a keyboard. The peripheral device adapters may also provide access to other external devices such as an external storage device, a number of network devices such as, for example, servers, switches, and routers, client devices, other types of computing devices, and combinations thereof.

The display device may be provided to allow a user of the scanning device to interact with and implement the functionality of the scanning device. The peripheral device adapters may also create an interface between the processor and the display device, a printer, or other media output devices. The network adapter may provide an interface to other computing devices within, for example, a network, thereby enabling the transmission of data between the scanning device and other devices located within the network.

Aspects of the present system and method are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general-purpose computer, special purpose computer, or other programmable data processing apparatus to produce a machine, such that the computer usable program code, when executed via, for example, the processor of the scanning device or other programmable data processing apparatus, implement the functions or acts specified in the flowchart and/or block diagram block or blocks. In one example, the computer usable program code may be embodied within a computer readable storage medium; the computer readable storage medium being part of the computer program product. In one example, the computer readable storage medium is a non-transitory computer readable medium.

The preceding description has been presented to illustrate and describe examples of the principles described. This description is not intended to be exhaustive or to limit these principles to any precise form disclosed. Many modifications and variations are possible in light of the above teaching.

What is claimed is:

1. A spherical identifier, comprising:
   a sphere comprising:
      a plurality of shells forming the sphere, a radially-defined code being discernable using the arrangement of the plurality of shells; and
      a center indicator marking a center of a great circle of the sphere to guide deconstruction of the spherical identifier to prepare the radially-defined code for reading by a scanner.

2. The identifier of claim 1, wherein the radially defined code is transferable to a one-dimensional barcode using a ray originating from the center of the sphere.

3. The identifier of claim 2, wherein at least two of the plurality of shells each have dissimilar thicknesses.

4. The identifier of claim 2, wherein at least two of the plurality of shells have a dissimilar color.

5. The identifier of claim 2, wherein at least two of the plurality of shells have a dissimilar pattern forming a cross-section of the shells.

6. The identifier of claim 2, wherein a number of the plurality of shells serve as fiducials in the one-dimensional barcode.

7. A three-dimensional (3D) object, comprising:
   a plurality of spheres manufactured into a body of the three-dimensional object;
   wherein each of the spheres comprise a plurality of shells, the shells constituting a radially definable code repeated within each sphere.

8. The three-dimensional object of claim 7, wherein at least one of the plurality of shells has a thickness different from another of the plurality of shells to encode the code in the different shell thicknesses of each sphere.

9. The three-dimensional object of claim 7, wherein the radial code is revealed after removing a portion of at least one of the spheres to its orthodrome.

10. The three-dimensional object of claim 7, wherein each shell is made of a specific color of material different from each neighboring shell.

11. The three-dimensional object of claim 7, wherein an interior of the three-dimensional object is completely filled by the number of spheres such that an outer surface of each sphere extends to an exterior surface of the three-dimensional object or an adjacent sphere within the object.

12. The three-dimensional object of claim 7, wherein each shell translates into a bar of a one-dimensional barcode.

13. The three-dimensional object of claim 7, wherein:
different spheres of the plurality of spheres have different diameters in order to fill more space within the three-dimensional object with the plurality of spheres; and
spheres with different diameters have shells of a same relative thickness to encode the same code in all the spheres regardless of diameter.

14. The three-dimensional object of claim 7, wherein:
in some portion of the three-dimensional object, full spheres of the plurality of spheres are formed;
in another portion of the three-dimensional object, at least one partial sphere is formed.

15. The three-dimensional object of claim 7, wherein an interior of the three-dimensional object is filled with the spheres except for a thin layer between the spheres and exterior walls of the three-dimensional object.

16. A method of identifying a three-dimensional object, comprising:
removing a portion of the three-dimensional object to reveal the orthodrome of a sphere embedded in the three-dimensional object; and
translating a radial pattern of the sphere into a one-dimensional barcode.

17. The method of claim 16, wherein the sphere comprises a number of shells defining the radial pattern.

18. The method of claim 17, wherein the three-dimensional object is composed of a number of spheres arranged such that outer shells of each of the spheres are touching.

19. The method of claim 16, further comprising, in an investigation of a defective part comprising the three-dimensional object, identifying data about the part of a manufacturer of the part from the barcode.

20. The method of claim 16, further comprising:
identifying a location marker on an exterior surface of the three-dimensional object marking a location of the sphere within the three-dimensional object; and
based on the location marker, grinding or carving away material of the three-dimensional object to expose the orthodrome of the sphere.

* * * * *